US009865771B2

(12) United States Patent
Nishi et al.

(10) Patent No.: US 9,865,771 B2
(45) Date of Patent: Jan. 9, 2018

(54) SEMICONDUCTOR LIGHT-EMITTING ELEMENT

(71) Applicants: QD LASER, INC., Kawasaki-shi, Kanagawa (JP); UNIVERSITY OF SHEFFIELD, Sheffield (GB)

(72) Inventors: Kenichi Nishi, Kawasaki (JP); Takeo Kageyama, Kawasaki (JP); Keizo Takemasa, Kawasaki (JP); Mitsuru Sugawara, Kawasaki (JP); Richard Hogg, Glasgow (GB); Siming Chen, London (GB)

(73) Assignees: QD LASER, INC., Kawasaki (JP); UNIVERSITY OF SHEFFIELD, Sheffield (GB)

( * ) Notice: Subject to any disclaimer, the term of this patent is extended or adjusted under 35 U.S.C. 154(b) by 0 days.

(21) Appl. No.: 15/110,991

(22) PCT Filed: Jan. 7, 2015

(86) PCT No.: PCT/JP2015/050266
§ 371 (c)(1),
(2) Date: Jul. 12, 2016

(87) PCT Pub. No.: WO2015/111432
PCT Pub. Date: Jul. 30, 2015

(65) Prior Publication Data
US 2016/0336480 A1  Nov. 17, 2016

(30) Foreign Application Priority Data

Jan. 27, 2014  (JP) ................................. 2014-012838

(51) Int. Cl.
*H01L 33/06* (2010.01)
*H01L 33/08* (2010.01)
(Continued)

(52) U.S. Cl.
CPC .............. *H01L 33/06* (2013.01); *H01L 33/08* (2013.01); *H01L 33/24* (2013.01); *H01L 33/32* (2013.01)

(58) Field of Classification Search
CPC ......... H01L 33/06; H01L 33/32; H01L 33/24; H01L 33/08
See application file for complete search history.

(56) References Cited

U.S. PATENT DOCUMENTS 6,573,527 B1 * 6/2003 Sugiyama .............. B82Y 10/00
257/14
8,483,252 B2 * 7/2013 Hatori .................... B82Y 20/00
372/46.01
(Continued)

FOREIGN PATENT DOCUMENTS

GB          2492771 A      1/2013
JP       2005-72338 A1     3/2005
(Continued)

OTHER PUBLICATIONS

S. Chen, et al.; "Hybrid Quantum Well/Quantum Dot Structure for Broad Spectral Bandwidth Emitters;" IEEE Journal of Selected Topics in Quantum Electronics; vol. 19; No. 4; Jul./Aug. 2013 (9 Sheets)/p. 1 of specification.
(Continued)

*Primary Examiner* — William Coleman
(74) *Attorney, Agent, or Firm* — Kratz, Quintos & Hanson, LLP

(57) ABSTRACT

A semiconductor light-emitting element includes: a lower clad layer 12 that is provided on a substrate 10; an active layer 20 that is provided on the lower clad layer 12 and includes a quantum well layer 24 and a plurality of quantum dots 28 sandwiching a second barrier layer 22b together with the quantum well layer 24; and an upper clad layer 14 that is provided on the active layer 20, wherein a distance D
(Continued)

between the quantum well layer 24 and the plurality of quantum dots 28 is smaller than an average of distances X between centers of the plurality of quantum dots 28.

18 Claims, 11 Drawing Sheets

(51) Int. Cl.
*H01L 33/24* (2010.01)
*H01L 33/32* (2010.01)

(56) References Cited

U.S. PATENT DOCUMENTS

| | | | |
|---|---|---|---|
| 8,558,245 B2* | 10/2013 | Yamamoto | B82Y 20/00 257/79 |
| 9,203,215 B2* | 12/2015 | Makino | H01S 5/18311 |
| 2005/0045868 A1 | 3/2005 | Otsubo | |
| 2006/0226416 A1 | 10/2006 | Lee | |
| 2010/0032552 A1 | 2/2010 | Doshida | |
| 2012/0285537 A1* | 11/2012 | Yoshikawa | B82Y 20/00 136/262 |
| 2013/0270517 A1* | 10/2013 | Nozawa | H01L 33/04 257/13 |
| 2014/0007921 A1* | 1/2014 | Kuramachi | B82Y 20/00 136/247 |
| 2016/0161065 A1* | 6/2016 | Sung | B32B 27/38 362/84 |

FOREIGN PATENT DOCUMENTS

| | | |
|---|---|---|
| JP | 2008-78578 A1 | 4/2008 |
| JP | 2009-65143 A1 | 3/2009 |
| JP | 2012-109434 A1 | 6/2012 |

OTHER PUBLICATIONS

J. Davies; "Quantum dots induced by strain from buried and surface stressors;" Applied Physics Letters; vol. 75; No. 26; Dec. 27, 1999; pp. 4142-4144 and cover sheet (4 Sheets total)/p. 1 of specification.

M. Sopanen, et al.; "Strain-induced quantum dots by self-organized stressors;" Applied Physics Letters; vol. 66; No. 18; May 1, 1995; pp. 2364-2366 and cover sheet (4 Sheet total)/p. 1 of specification.

H. Lipsanen, et al.; "Luminescence from excited states in strain-induced InxGa1-xAs quantum dots;" Physical Review B; vol. 51; No. 19; May 15, 1995; pp. 13868-13871 (4 Sheets)/p. 1 of specification.

International Search Report for International Application No. PCT/JP2015/050266 dated Apr. 14, 2015.

T. Chung, et al.; "Coupled strained-layer InGaAs quantum-well improvement of an InAs quantum dot AlGaAs-GaAs-InGaAs-InAs heterostructure laser;" Applied Physics Letters; vol. 79; No. 27; Dec. 31, 2001; pp. 4500-4502 (3 Sheets)/Cited in Extended European Search Report for counterpart EPC Patent Application No. 15740889.9 dated Jul. 17, 2017.

N. Ulbrich, et al.; "Midinfrared intraband electroluminescence from AlInAs quantum dots;" Applied Physics Letters; vol. 83; No.8; Aug. 25, 2003; pp. 1530-1532 (3 Sheets)/Cited in Extended European Search Report for counterpart EPC Patent Application No. 15740889.9 dated Jul. 17, 2017.

G. Walter, et al.; "Room-temperature continuous photopumped laser operation of coupled InP quantum dot and InGaP quantum well InP-InGaP-In(AlGa)P-InAlP heterostructures;" Applied Physics Letters; vol. 79; No. 13; Sep. 24, 2001; pp. 1956-1958 (3 Sheets)/Cited in Extended European Search Report for counterpart EPC Patent Application No. 15740889.9 dated Jul. 17, 2017.

Extended European Search Report for counterpart EPC Patent Application No. 15740889.9 dated Jul. 17, 2017 (10 Sheets).

* cited by examiner

SEMICONDUCTOR LIGHT-EMITTING ELEMENT

TECHNICAL FIELD

The present invention relates to a semiconductor light-emitting element.

BACKGROUND ART

Recently, a light-emitting element having a wide luminescence wavelength band is needed for optical sensing such as OCT (Optical Coherence Tomography). For example, a semiconductor light-emitting element having a hybrid structure of a quantum well and a quantum dot is supposed (for example, see Non-Patent Document 1). The semiconductor light-emitting element having the hybrid structure achieves a wide luminescence wavelength band by luminescence in which wavelengths from the quantum well and the quantum dot are different from each other. A strain field is formed around a self-formed quantum dot. It is known that when the strain field has influence on the quantum well layer, band gap energy of the quantum well layer changes (For example, see Non-Patent Documents 2 to 4).

NON-PATENT DOCUMENT

Non-Patent Document 1: Siming Chen, other 7, "Hybrid Quantum Well/Quantum Dot Structure for Broad Spectral Bandwidth Emitters", IEEE JOURNAL OF SELECTED TOPICS IN QUANTUM ELECTRONICS, 2013, Vol 19, No. 4.

Non-Patent Document 2: John H. Davies, "Quantum dots induced by strain from buried and surface stressors", APPLIED PHYSICS LETTERS, 1999, Vol 75, No. 26, p. 4141-4144.

Non-Patent Document 3: M. Sopanen, other 2, "Strain-induced quantum dots by self-organized stressors", APPLIED PHYSICS LETTERS, 1995, Vol. 66, No. 18, p. 2363-2366.

Non-Patent Document 4: H. Lipsanen, other 2, "Luminescence from excited states in strain-induced $In_xGa_{1-x}As$ quantum dots", PHYSICAL REVIEW B, 1995, Vol. 51, No. 19, p. 13868-13871.

SUMMARY OF THE INVENTION

Problem to be Solved by the Invention

The semiconductor light-emitting element disclosed in Non-Patent Document 1 achieves a wide luminescence wavelength band by overlapping luminescence from the quantum well and luminescence from the quantum dot. Therefore, luminescence from the quantum well and luminescence from the quantum dot are needed. Accordingly, for example, there is a room for improving a problem that the luminescence wavelength band cannot be widened in a wavelength band in which luminescence from the quantum dot is not achieved.

The present invention was devised in view of the above problems, and it is an object of the present invention to provide a semiconductor light-emitting element that is capable of achieving a wide luminescence wavelength band.

Means for Solving the Problem

The present invention is a semiconductor light-emitting element characterized by including: a lower clad layer that is provided on a substrate; an active layer that is provided on the lower clad layer and includes a quantum well layer and a plurality of quantum dots sandwiching a barrier layer together with the quantum well layer; and an upper clad layer that is provided on the active layer, wherein a distance between the quantum well layer and the plurality of quantum dots is smaller than an average of distances between centers of the plurality of quantum dots.

In the above-mentioned configuration, the distance between the quantum well layer and the plurality of the quantum dots may be ⅓ of an average of distances between centers of the plurality of quantum dots or more, and is ⅔ of the average or less.

In the above-mentioned configuration, a thickness of the barrier layer between the quantum well layer and the plurality of quantum dots may be a thickness in which a tunnel current does not flow between the quantum well layer and the plurality of quantum dots.

In the above-mentioned configuration, band gap energy of the quantum well layer may be modulated by influence of a strain field caused by the plurality of quantum dots in a direction in parallel with an upper face of the substrate.

In the above-mentioned configuration, the quantum well layer and the quantum dot may be a III-V group compound semiconductor layer; and at least one of the quantum well layer and the quantum dot may include In as a III group element.

In the above-mentioned configuration, the quantum well layer may be an InGaAs layer; and the quantum dot may be InAs.

In the above-mentioned configuration, the quantum well layer may be a GaAs layer; and the quantum dot may be AlInAs In the above-mentioned configuration, at least one of the quantum well layer and the quantum dot may include nitrogen as a V group element.

In the above-mentioned configuration, the active layer may include a plurality of the quantum well layers; and thicknesses of the plurality of quantum well layers may be different from each other.

Effects of the Invention

According to the present invention, a wide luminescence wavelength band can be achieved.

EMBODIMENTS FOR CARRYING OUT THE INVENTION

A description will be given of embodiments of the invention, with reference to drawings.

[First Embodiment]

Figure 1A:
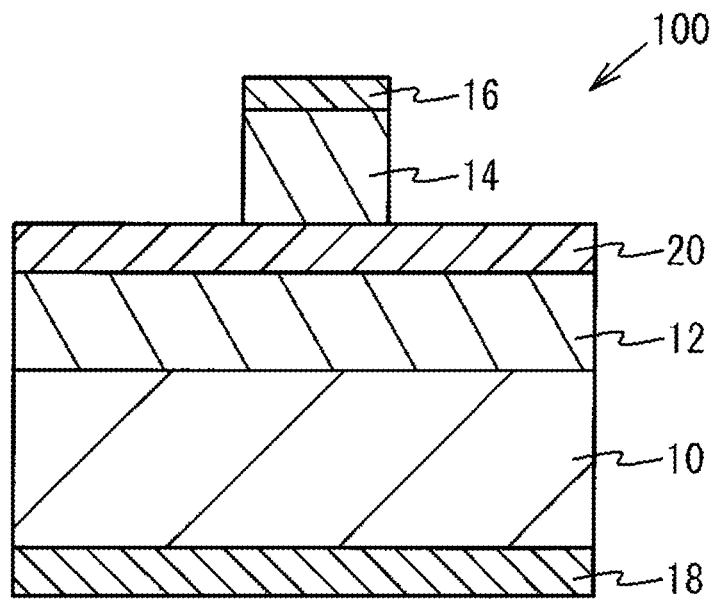
FIG. 1A illustrates a cross sectional view of a photo diode in accordance with a first embodiment in parallel with an edge face thereof.
Figure 1B:
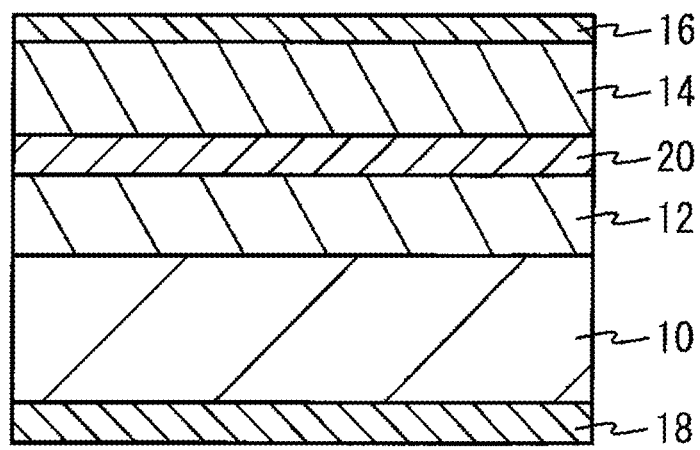
FIG. 1B illustrates a cross sectional view in parallel with a side face.

FIG. 1A illustrates a cross sectional view of a photo diode in accordance with a first embodiment in parallel with an edge face thereof. FIG. 1B illustrates a cross sectional view in parallel with a side face. As illustrated in FIG. 1A and FIG. 1B, a photo diode 100 in accordance with the first embodiment has a lower clad layer 12 on a substrate 10. The substrate 10 is, for example, an n-type GaAs substrate. The lower clad layer 12 is, for example, an n-type AlGaAs layer. For example, an n-type GaAs layer acting as a buffer layer may be provided between the substrate 10 and the lower clad layer 12.

An active layer 20 is provided on the lower clad layer 12. Details of the active layer 20 will be described later. An upper clad layer 14 is provided on the active layer 20. The upper clad layer 14 has an independently projecting shape. The upper clad layer 14 is, for example, a p-type AlGaAs layer. A p-electrode 16 is provided on the upper clad layer 14. An n-electrode 18 is provided under the substrate 10. The p-electrode 16 is, for example, a metal film in which Au, Zn and Au are laminated from the upper clad layer 14 side. The n-electrode 18 is, for example, a metal film in which InGe and Au are laminated from the substrate 10 side. For example, a p-type GaAs layer acting as a contact layer may be provided between the upper clad layer 14 and the p-electrode 16.

Figure 2:
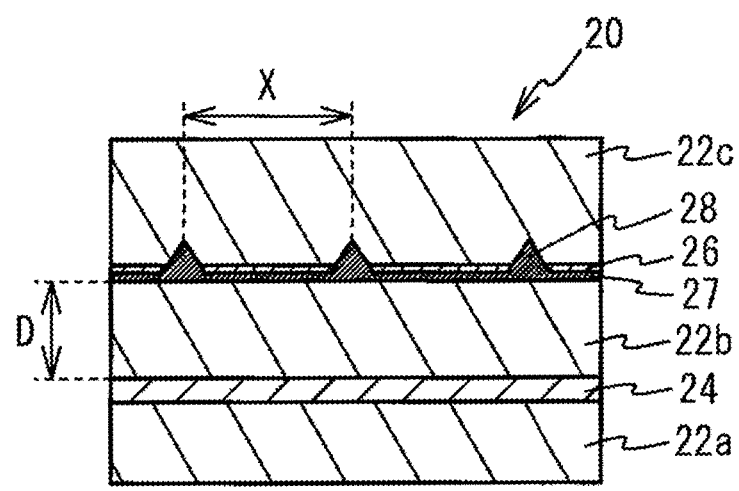
FIG. 2 illustrates a cross sectional view of an active layer of a photo diode in accordance with a first embodiment.

FIG. 2 illustrates a cross sectional view of the active layer of the photo diode in accordance with the first embodiment. As illustrated in FIG. 2, the active layer 20 has a first barrier layer 22a to a third barrier layer 22c, a quantum well layer 24, an InGaAs layer 26, a wetting layer 27 and a plurality of quantum dots 28. The quantum well layer 24 is provided on the first barrier layer 22a. A second barrier layer 22b is provided on the quantum well layer 24. The plurality of quantum dots 28 are provided on the second barrier layer 22b. The InGaAs layer 26 is provided on the wetting layer 27 having the same material as the plurality of quantum dots 28. The third barrier layer 22c is provided on the plurality of quantum dots 28 and the InGaAs layer 26. A distance D between the quantum well layer 24 and the plurality of quantum dots 28 (that is, a distance between an upper face of the quantum well layer 24 and a lower edge of the plurality of quantum dots 28) is smaller than an average of distances X between centers of the plurality of quantum dots 28.

The first barrier layer 22a to the third barrier layer 22c are made of a material having band gap energy that is larger than that of the quantum well layer 24 and is, for example, made of a GaAs layer. The quantum well layer 24 is, for example, an InGaAs layer. The plurality of quantum dots 28 are made of a material having band gap energy that is smaller than that of the first barrier layer 22a to the third barrier layer 22c and is, for example, made of InAs. The wetting layer 27 is made of the same material as that of the plurality of quantum dots 28 and is, for example, made of InAs. The plurality of quantum dots 28 are formed by a self-formation growth method based on S-K (Stranski-Krastanov) growth mode. That is, when a material (for example, InAs) having a lattice constant different from that of the substrate 10 is epitaxially grown on the second barrier layer 22b, a two-dimensional layer growth occurs at first. When a growth amount is increased, the layer growth is transferred to a three-dimensional growth so that a strain energy caused by a lattice constant difference is suppressed. And, the plurality of quantum dots 28 are formed.

Figure 3:
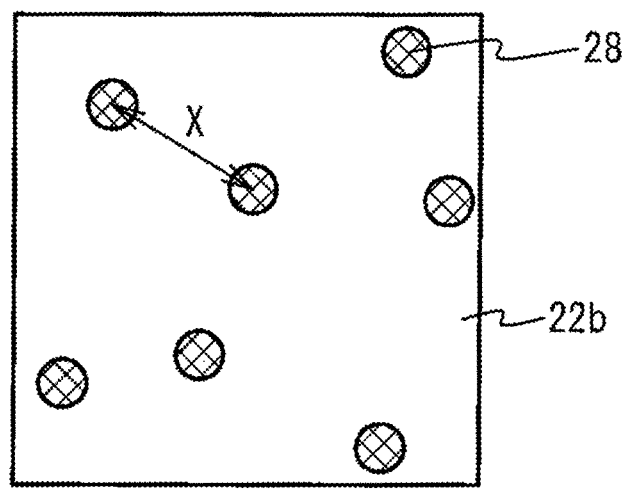
FIG. 3 illustrates an upper face of a quantum dot.

FIG. 3 illustrates an upper face of the quantum dots. The InGaAs layer 26 and the wetting layer 27 are omitted in FIG. 3. As illustrated in FIG. 3, the plurality of quantum dots 28 are dotted on the second barrier layer 22b. A surface density of the plurality of quantum dots 28 is, for example, $1 \times 10^9$ to $1 \times 10^{11}$ cm$^2$. It is possible to control the surface density of the plurality of quantum dots 28 by a growth condition. The surface density is within the above-mentioned range by a general growth condition. By the general growth condition, a height of the quantum dots 28 is, for example, 4 to 12 nm, a diameter of the quantum dots 28 is, for example, 20 to 30 nm, and the average of the distances X between the centers of the plurality of quantum dots 28 is, for example, 25 to 300 nm It is possible to calculate the average of the distances X between the centers of the plurality of quantum dots 28 by calculating a square root of an inverse number of the surface density of the plurality of quantum dots 28.

Figure 4A:
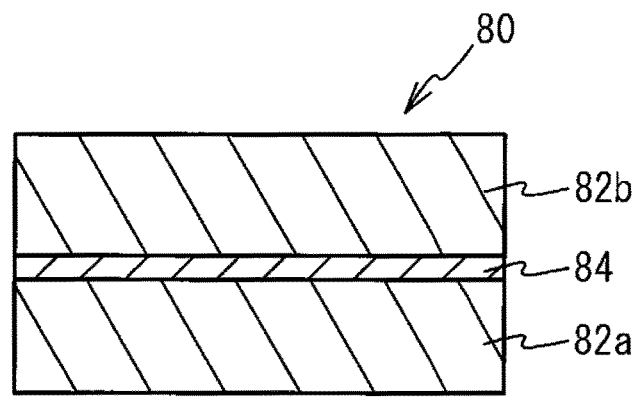
FIG. 4A and FIG. 4B illustrate a cross sectional view of an active layer of photo diodes of a first and a second comparative examples.
Figure 4B:
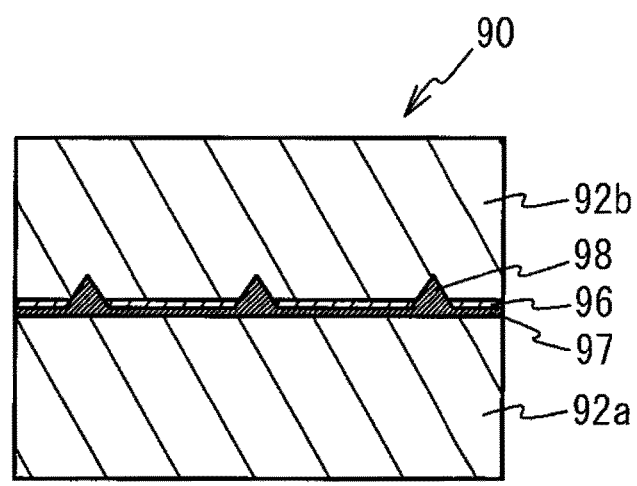

Here, a description will be given of experiments performed by the present inventors. First, a description will be given of experiments of photo diodes of a first comparative example and a second comparative example. FIG. 4A and FIG. 4B illustrate a cross sectional view of an active layer of the photo diodes of the first and the second comparative examples. As illustrated in FIG. 4A, an active layer 80 of the photo diode of the first comparative example has a structure in which a quantum well layer 84 is sandwiched by a first barrier layer 82a and a second barrier layer 82b. Other structures of the photo diode of the first comparative example are the same as the first embodiment. Therefore, an explanation of the other structures is omitted. In this manner, the first comparative example is a photo diode having a quantum well structure. As illustrated in FIG. 4B, an active layer 90 of the photo diode of the second comparative example has a structure in which a plurality of quantum dots 98 are provided on a first barrier layer 92a, and an InGaAs layer 96 is provided on a wetting layer 97 having the same material as that of the plurality of quantum dots 98. And, the active layer 90 has a structure in which a second barrier layer 92b is provided on the plurality of quantum dots 98 and the InGaAs layer 96. Other structures of the photo diode of the second comparative example are the same as the first embodiment. Therefore, an explanation of the other structures is omitted. In this manner, the second comparative example is a photo diode having a quantum dot structure.

The present inventors made the photo diodes of the first and second comparative examples and performed an electroluminescence measurement. A concrete structure of the photo diode of the first comparative example is shown in Table 1. A concrete structure of the photo diode of the second comparative example is shown in Table 2.

TABLE 1

| LAYER NAME | | MATERIAL | FILM THICKNESS (nm) |
|---|---|---|---|
| CONTACT LAYER | | p-GaAs | 100.0 |
| UPPER CLAD LAYER | | p-$Al_{0.35}Ga_{0.65}As$ | 400.0 |
| ACTIVE LAYER | SECOND BARRIER LAYER | GaAs | 100.0 |
| | QUANTUM WELL LAYER | $In_{0.34}Ga_{0.66}As$ | 7.0 |
| | FIRST BARRIER LAYER | GaAs | 76.5 |
| LOWER CLAD LAYER | | n-$Al_{0.35}Ga_{0.65}As$ | 400.0 |
| BUFFER LAYER | | n-GaAs | 200.0 |
| SUBSTRATE | | n-GaAs | — |

As shown in Table 1, in the photo diode of the first comparative example, an n-type GaAs substrate was used as the substrate 10, and a buffer layer of an n-type GaAs layer having a film thickness of 200 nm was provided between the substrate 10 and the lower clad layer 12. An n-type $Al_{0.3}Ga_{0.65}As$ layer having a film thickness of 400 nm was used as the lower clad layer 12. A GaAs layer having a film thickness of 76.5 nm was used as the first barrier layer 82a of the active layer 80. An $In_{0.34}Ga_{0.66}As$ layer having a film thickness of 7.0 nm was used as the quantum well layer 84. A GaAs layer having a film thickness of 100 nm was used as the second barrier layer 82b. A p-type $Al_{0.35}Ga_{0.65}As$ layer having a film thickness of 400 nm was used as the upper clad layer 14. A contact layer made of a p-type GaAs layer having a film thickness of 100 nm was provided on the upper clad layer 14.

TABLE 2

| LAYER NAME | | MATERIAL | FILM THICKNESS (nm) |
|---|---|---|---|
| CONTACT LAYER | | p-GaAs | 100.0 |
| UPPER CLAD LAYER | | p-$Al_{0.35}Ga_{0.65}As$ | 400.0 |
| ACTIVE LAYER | SECOND BARRIER LAYER | GaAs | 100.0 |
| | InGaAs LAYER | $In_{0.18}Ga_{0.82}As$ | 1.0 |
| | QUANTUM DOT | InAs | 0.7 |
| | FIRST BARRIER LAYER | GaAs | 76.5 |
| LOWER CLAD LAYER | | n-$Al_{0.35}Ga_{0.65}As$ | 400.0 |
| BUFFER LAYER | | n-GaAs | 200.0 |
| SUBSTRATE | | n-GaAs | — |

As shown in Table 2, in the photo diode of the second comparative example, a GaAs layer having a film thickness of 76.5 nm was used as the first barrier layer 92a of the active layer 90. InAs having a thickness corresponding to a supply amount of 0.7 nm was used as the plurality of quantum dots 98. A height of the plurality of quantum dots 98 is 5 nm or the like. An $In_{0.18}Ga_{0.82}As$ layer having a film thickness of 1.0 nm was used as the InGaAs layer 96. A GaAs layer having a film thickness of 100 nm was used as the second barrier layer 92b. A surface density of the plurality of quantum dots 98 was $2 \times 10^{10}$ $cm^{-2}$. Others are the same as the photo diode of the first comparative example shown in Table 1.

Figure 5A:
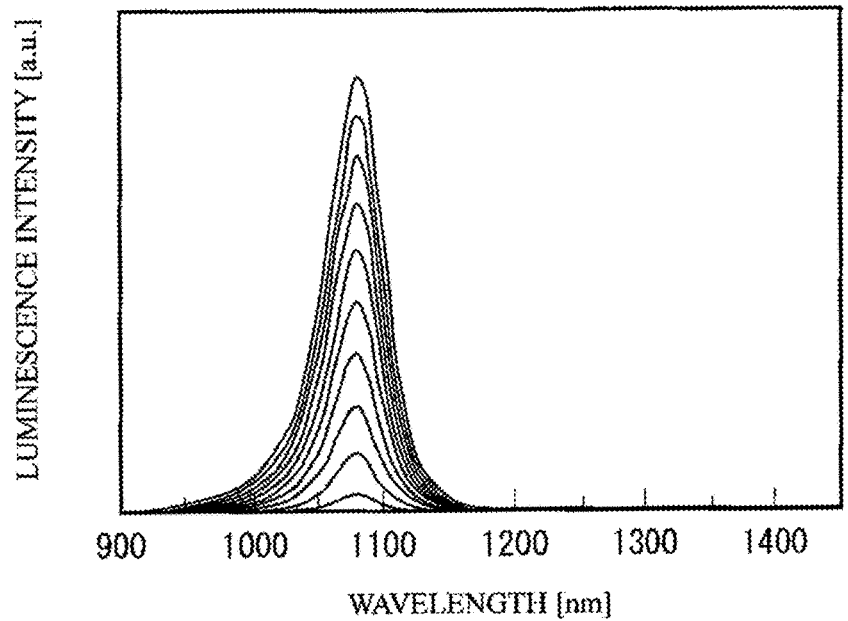
FIG. 5A and FIG. 5B illustrate measurement results of electroluminescence measurement of photo diodes of a first and a second comparative examples.
Figure 5B:
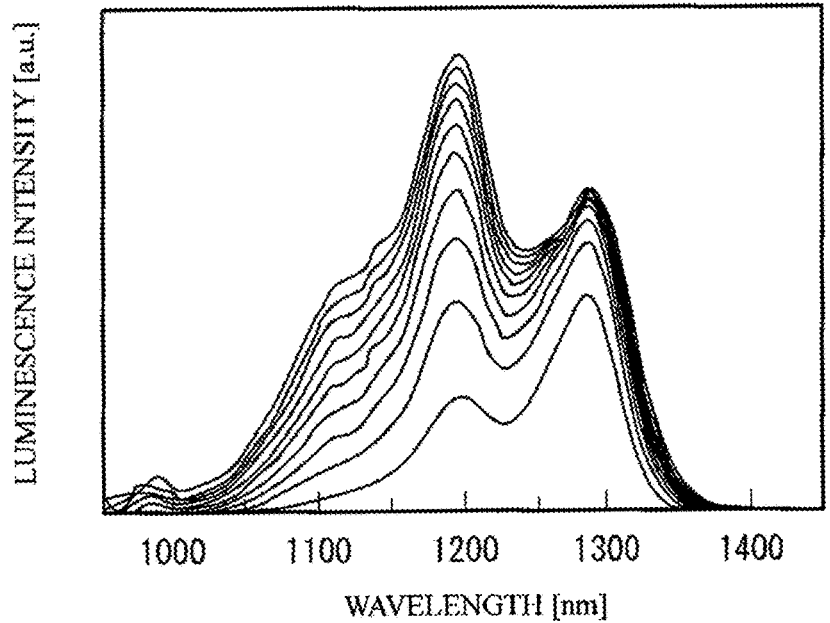

FIG. 5A and FIG. 5B illustrate measurement results of the electroluminescence measurement of the photo diodes of the first and the second comparative examples. The electroluminescence measurement was performed at an environmental temperature of 20 degrees C. With respect to the photo diode of the first comparative example, an injection current was increased from 0 mA to 400 mA with 40 mA increments, and luminescence emission spectra were measured. With respect to the photo diode of the second comparative example, an injection current was increased from 0 mA to 200 mA with 20 mA increments, and luminescence emission spectra were measured. As illustrated in FIG. 5A, the photo diode of the first comparative example having the quantum well structure has an emission peak wavelength around 1080 nm As illustrated in FIG. 5B, the photo diode of the second comparative example having the quantum dot structure has emission peak wavelengths around 1190 nm and 1290 nm The luminescence having a peak around 1290 nm is luminescence from a ground state. The luminescence having a peak around 1190 nm is luminescence from a first excitation state.

Figure 6:
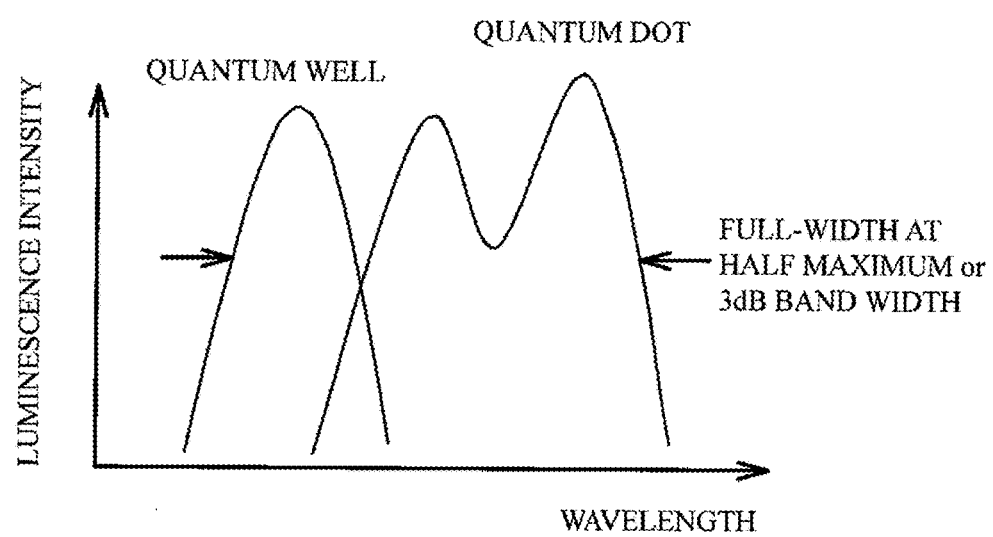
FIG. 6 illustrates a schematic view of emission spectra of a photo diode having a hybrid structure.

Here, a description will be given of emission spectra in a case where a luminescence wavelength from a quantum well is smaller than that of a quantum dot, in a photo diode having a hybrid structure of Non-Patent Document 1. FIG. 6 illustrates a schematic view of emission spectra of a photo diode having a hybrid structure. As illustrated in FIG. 6, luminescence from the quantum well and luminescence from the quantum dot occur. When the luminescence from the quantum well overlaps with the luminescence from the quantum dot, a wide luminescence wavelength band can be achieved. However, in this case, the luminescence from the quantum well and the luminescence from the quantum dot are requested. Therefore, for example, there is a problem that the luminescence wavelength band cannot be broadened in a wavelength band in which the luminescence from the quantum dot is not achieved.

Next, a description will be given of an experiment performed with respect to the photo diode of the first embodiment. The present inventors made two samples (sample 1 and sample 2) in which film thicknesses of the first barrier layer 22a and the second barrier layer 22b of the active layer 20 are different from each other. And the electroluminescence measurement was performed. Concrete structures of the photo diodes of the first embodiment (sample 1 and sample 2) were shown in Table 3.

TABLE 3

| LAYER NAME | | MATERIAL | FILM THICKNESS (nm) | |
|---|---|---|---|---|
| | | | SAMPLE 1 | SAMPLE 2 |
| CONTACT LAYER | | p-GaAs | 100.0 | 100.0 |
| UPPER CLAD LAYER | | p-Al$_{0.35}$Ga$_{0.65}$As | 400.0 | 400.0 |
| ACTIVE LAYER | THIRD BARRIER LAYER | GaAs | 100.0 | 100.0 |
| | InGaAs LAYER | In$_{0.18}$Ga$_{0.82}$As | 1.0 | 1.0 |
| | QUANTUM DOT | InAs | 0.7 | 0.7 |
| | SECOND BARRIER LAYER | GaAs | 35.5 | 15.5 |
| | QUANTUM WELL LAYER | In$_{0.34}$Ga$_{0.66}$As | 7.0 | 7.0 |
| | FIRST BARRIER LAYER | GaAs | 56.6 | 76.5 |
| LOWER CLAD LAYER | | n-Al$_{0.35}$Ga$_{0.65}$As | 400.0 | 400.0 |
| BUFFER LAYER | | n-GaAs | 200.0 | 200.0 |
| SUBSTRATE | | n-GaAs | — | — |

As shown in Table 3, in the sample 1, a GaAs layer having a film thickness of 56.5 nm was used as the first barrier layer 22a of the active layer 20. An In$_{0.34}$Ga$_{0.66}$As layer having a film thickness of 7 nm was used as the quantum well layer 24. A GaAs layer having a film thickness of 35.5 nm was used as the second barrier layer 22b. InAs having a thickness corresponding to a supply amount of 0.7 nm was used as the plurality of quantum dots 28. A height of the plurality of quantum dots 28 was 5 nm or the like. An In$_{0.18}$Ga$_{0.82}$As layer having a film thickness of 1.0 nm was used as the InGaAs layer 26. A GaAs layer having a film thickness of 100 nm was used as the third barrier layer 22c. A surface density of the plurality of quantum dots 28 was 2×10$^{10}$ cm$^{-2}$. That is, an average of distances between the centers of the plurality of quantum dots 28 was 70 nm Others are the same as the photo diode of the first comparative example shown in Table 1.

In the sample 2, a GaAs layer having a film thickness of 76.5 nm was used as the first barrier layer 22a of the active layer 20. An In$_{0.34}$Ga$_{0.66}$As layer having a film thickness of 7 nm was used as the quantum well layer 24. A GaAs layer having a film thickness of 15.5 nm was used as the second barrier layer 22b. InAs having a thickness corresponding to a supply amount of 0.7 nm was used as the plurality of quantum dots 28. A height of the plurality of quantum dots 28 was 5 nm or the like.

An In$_{0.18}$Ga$_{0.82}$As layer having a film thickness of 1.0 nm was used as the InGaAs layer 26. A GaAs layer having a film thickness of 100 nm was used as the third barrier layer 22c. A surface density of the plurality of quantum dots 28 was 5×10$^{10}$ cm$^{-2}$. That is, an average of the distances between the centers of the plurality of quantum dots 28 was 45 nm Others are the same as the photo diode of the first comparative example shown in Table 1.

Figure 7A:
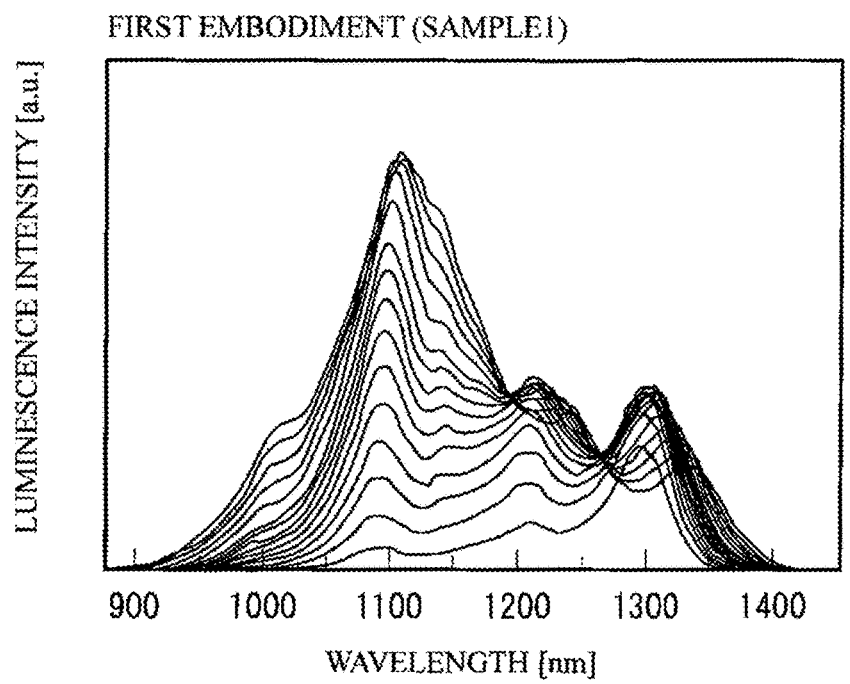
FIG. 7A and FIG. 7B illustrate measurement results of electroluminescence measurement of a photo diode of a first embodiment.
Figure 7B:
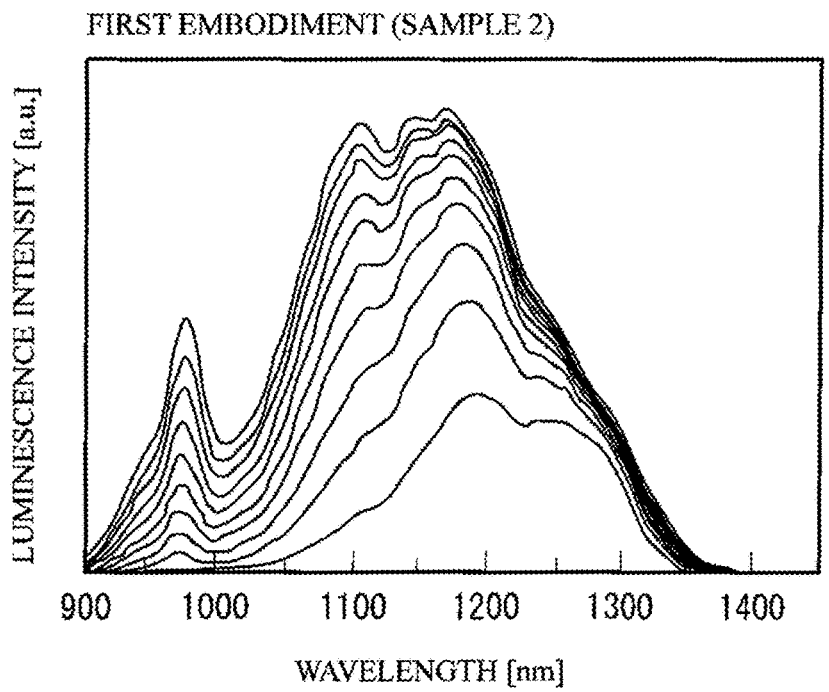

FIG. 7A and FIG. 7B illustrate measurement results of the electroluminescence measurement of the photo diodes of the first embodiment. The electroluminescence measurement was performed at an environmental temperature of 20 degrees C. With respect to the sample 1, an injection current was increased from 0 mA to 300 mA with 20 mA increments, and luminescence emission spectra were measured. With respect to the sample 2, an injection current was increased from 0 mA to 100 mA with 10 mA increments, and luminescence spectra were measured. As illustrated in FIG. 7A and FIG. 7B, with respect to the luminescence from the quantum well having an emission peak wavelength around 1080 nm, a luminescence wavelength band of the photo diodes of the first embodiment (sample 1 and sample 2) is wider than that of the photo diode of the first comparative example illustrated in FIG. 5A. The luminescence wavelength band (for example, 3 dB band width) from the quantum well of the photo diode of the first embodiment is twice as that of the first comparative example. In FIG. 7B, a peak of luminescence is around 980 nm A factor of the luminescence is not apparent.

Figure 8:
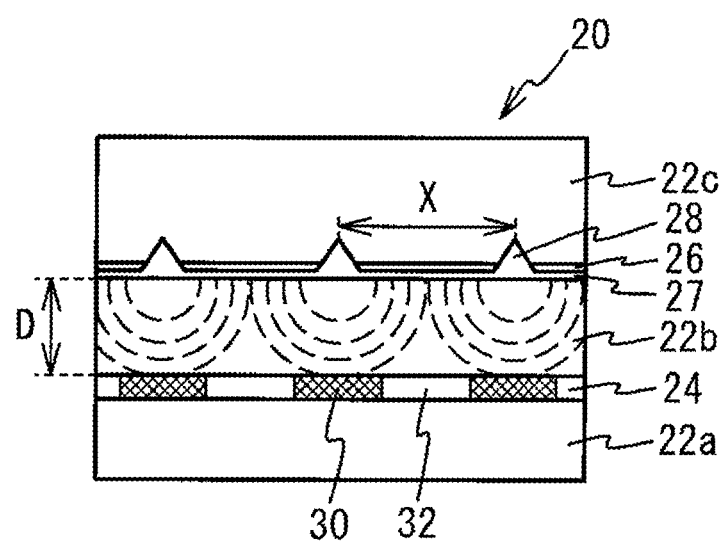
FIG. 8 illustrates a cross sectional view of an active layer for describing a reason that a luminescence wavelength band is widened.

In this manner, in the first embodiment, the luminescence wavelength band from the quantum well is wider than that of the first comparative example. It is thought that reasons are as follows. FIG. 8 illustrates a cross sectional view of an active layer for describing the reasons that the luminescence wavelength band was widened. In FIG. 8, hatch is omitted for clearing the figure. As illustrated in FIG. 8, the quantum dot 28 formed by the self-formation growth method of S-K mode forms a strain field (dotted line) therearound. The distance D between the quantum well layer 24 and the plurality of quantum dots 28 is smaller than the average of the distances X between the centers of the plurality of quantum dots 28. Therefore, influence of the strain field caused by the quantum dot 28 is large in a region 30 under the quantum dot 28 in the quantum well layer 24. However, the influence is small in a region 32 under a center portion of the adjacent quantum dot 28. As disclosed in Non-Patent Documents 2 to 4, the strain field caused by the quantum dot 28 reduces band gap energy of the quantum well layer 24. Therefore, the band gap energy in the region 30 under the quantum dot 28 of the quantum well layer 24 is smaller than in the region 32 under the center portion of the adjacent quantum dot 28. That is, the band gap energy of the quantum well layer 24 is modulated in a direction in parallel with the upper face of the substrate 10. Thus, as illustrated in FIG. 7A and FIG. 7B, it is thought that the luminescence wavelength band from the quantum well is widened.

In the first embodiment, the active layer 20 includes the quantum well layer 24 and the plurality of quantum dots 28 that sandwich the second barrier layer 22b together with the quantum well layer 24. And, the distance D between the quantum well layer 24 and the plurality of quantum dots 28 is smaller than the average of the distances X between the centers of the plurality of quantum dots 28. Therefore, as illustrated in FIG. 8, the band gap energy of the quantum well layer 24 is modulated because of the influence of the strain field of the plurality of quantum dots 28 in the direction in parallel with the upper face of the substrate 10. Thus, as illustrated in FIG. 7A and FIG. 7B, the luminescence wavelength band from the quantum well can be widened. Therefore, the wide luminescence wavelength band can be achieved.

In the photo diode disclosed in Non-Patent Document 1, it is difficult to broaden the luminescence wavelength band except for within a wavelength band in which luminescence from the quantum well and luminescence the quantum dots are achieved. In contrast, in the first embodiment, when the luminescence from the quantum well is achieved, it is possible to broaden the luminescence wavelength band. Therefore, it is possible to broaden the luminescence wavelength band in a case where a GaAs layer is used as the quantum well layer 24. And, it is possible to achieve the wide luminescence wavelength band within 800 to 900 nm used for OCT of eyes. The luminescence has only to occur from the quantum well. Therefore, when the luminescence does not occur from the plurality of quantum dots 28, the quantum dots 28 may be made of a material not emitting a light. In this case, it is possible to enlarge the luminescence intensity from the quantum well caused by an injection current. Of course, when the plurality of quantum dots 28 emit a light, a wider luminescence wavelength band may be achieved.

When the distance D between the quantum well layer 24 and the plurality of quantum dots 28 is excessively small, a size balance between a region on which the plurality of quantum dots 28 of the quantum well layer 24 have large influence of strain field and a region on which the plurality of quantum dots 28 of the quantum well layer 24 have small influence of the strain field may be degraded. On the contrary, when the distance D between the quantum well layer 24 and the plurality of quantum dots 28 is excessively large, the strain field caused by the plurality of quantum dots 28 evenly has influence on whole region of the quantum well layer 24. Therefore, in order to adequately modulate bad gap energy of the quantum well layer 24, it is preferable that the distance D between the quantum well layer 24 and the plurality of quantum dots 28 is ¼ of the average of the distances X between the centers of the plurality of quantum dots 28 or more, and is ¾ of the average or less. It is more preferable that the distance D is ⅓ of the average or more, and is ⅔ of the average or less. It is much more preferable that the distance D is ⅖ of the average or more, and is ⅗ of the average or less. It is much more preferable that the distance D is ½ of the average.

It is preferable that the thickness of the second barrier layer 22b between the quantum well layer 24 and the plurality of quantum dots 28 is a thickness in which a tunnel current does not flow between the quantum well layer 24 and the plurality of quantum dots 28. Thus, the luminescence intensity from the quantum well can be enhanced.

The quantum well layer 24 and the quantum dots 28 may be a III-V group compound semiconductor layer. At least one of the quantum well layer 24 and the quantum dots 28 may includes In as III group element. For example, as in the case of the first embodiment, the substrate 10 may be a GaAs layer. The quantum well layer 24 may be an InGaAs layer. The first to third barrier layers 22a to 22c may be a GaAs layer. The plurality of quantum dots 28 may be made of InAs and may emit a light within 1000 nm to 1200 nm from the quantum well. As mentioned above, the quantum well layer 24 may be a GaAs layer. In this case, AlInAs may be used as the plurality of quantum dots 28.

For example, the substrate 10 may be a GaAs substrate. The quantum well layer 24 may be an AlGaInP layer. The first to third barrier layers 22a to 22c may be an AlGaInP layer. The plurality of quantum dots 28 may be made of InP and may emit a light within 630 nm to 850 nm from the quantum well. For example, the substrate 10 may be an InP substrate. The quantum well layer 24 may be an InGaAsP layer and an AlInGaAs layer. The first to third barrier layers 22a to 22c may be an InGaAsP layer and an AlGaInGaAs layer. The plurality of quantum dots 28 may be made of InAs and may emit a light within 1200 nm to 1700 nm from the quantum well. For example, at least one of the quantum well layer 24 and the quantum dots 28 may includes nitrogen (N) as a V group element. The substrate 10 may be a GaN substrate. The quantum well layer 24 may be an InGaN layer. The first to third barrier layers 22a to 22c may be an AlGaN layer. The plurality of quantum dots 28 may be made of InN and may emit a light within 300 nm to 600 from the quantum well.

Figure 9:
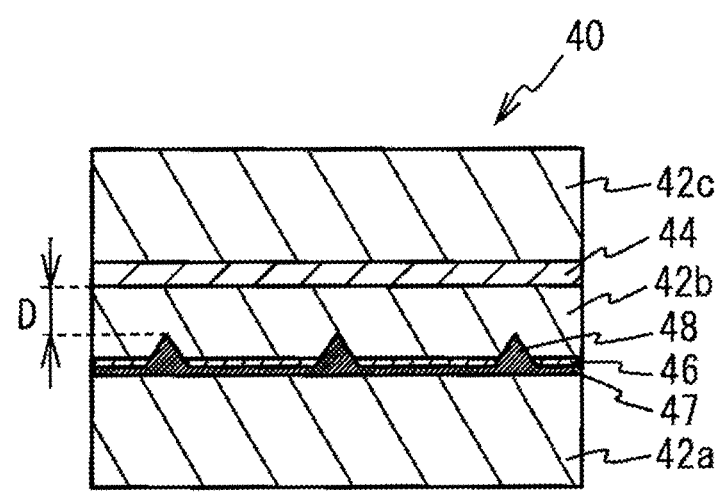
FIG. 9 illustrates a cross sectional view of an active layer of a photo diode in accordance with a first modified embodiment of a first embodiment.

FIG. 9 illustrates a cross sectional view of an active layer of a photo diode in accordance with a first modified embodiment of the first embodiment. As illustrated in FIG. 9, an active layer 40 of the photo diode of the first modified embodiment of the first embodiment is different from the first embodiment in a point that positions of a quantum well layer 44 and a plurality of quantum dots 48 are reversed. That is, the plurality of quantum dots 48 are provided on a first barrier layer 42a, and an InGaAs layer 46 is provided on a wetting layer 47 having the same material as the plurality of quantum dots 48. A second barrier layer 42b is provided on the plurality of quantum dots 48 and the InGaAs layer 46. The quantum well layer 44 is provided on the second barrier layer 42b, and a third barrier layer 42c is provided on the quantum well layer 44. Other structures of the photo diode of the first modified embodiment of the first embodiment are the same as those of the first embodiment. Therefore, an explanation of the other structures is omitted.

In the first modified embodiment of the first embodiment, when the distance D between the quantum well layer 44 and the plurality of quantum dots 48 (that is, an interval between the lower face of the quantum well layer 44 and the upper edge of the plurality of quantum dots 48) is smaller than the average of the centers between the plurality of quantum dots 48, the luminescence wavelength band from the quantum well can be widened. And the wide luminescence wavelength band can be achieved.

Figure 10:
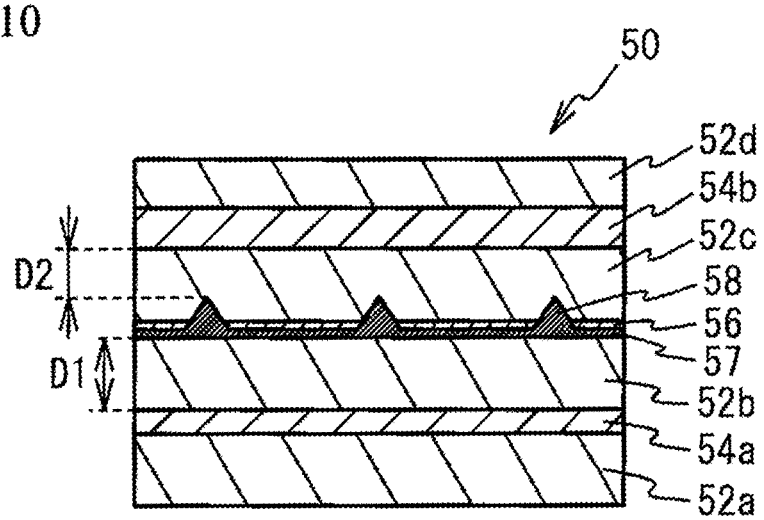
FIG. 10 illustrates a cross sectional view of an active layer of a photo diode in accordance with a second modified embodiment of a first embodiment.

FIG. 10 illustrates a cross sectional view of an active layer of a photo diode in accordance with a second modified embodiment of the first embodiment. As illustrated in FIG. 10, an active layer 50 of the photo diode of the second modified embodiment of the first embodiment has a structure in which the active layer 20 of the photo diode of the first embodiment is combined with the active layer 40 of the photo diode of the first modified embodiment of the first embodiment. That is, a first quantum well layer 54a is provided on a first barrier layer 52a, and a second barrier layer 52b is provided on the first quantum well layer 54a. A plurality of quantum dots 58 are provided on the second barrier layer 52b, and an InGaAs layer 56 is provided on a wetting layer 57 having the same material as the plurality of quantum dots 58. A third barrier layer 52c is provided on the plurality of quantum dots 58 and the InGaAs layer 56. A second quantum well layer 54b is provided on the third barrier layer 52c, and a fourth barrier layer 52d is provided on the second quantum well layer 54b. Other structures of the photo diode of the second modified embodiment of the first embodiment are the same as those of the first embodiment. Therefore, an explanation of the other structures is omitted.

In the second modified embodiment of the first embodiment, a distance D1 between the first quantum well layer 54a and the plurality of quantum dots 58 and a distance D2 between the second quantum well layer 54b and the plurality of quantum dots 58 are also smaller than an average of distances between centers of the plurality of quantum dots 58. Thus, the luminescence quantum band from the quantum well can be widened. And, a wider luminescence wavelength band can be achieved.

When the active layer 50 includes the plurality of quantum well layers (the first quantum well layer 54a and the second quantum well layer 54b), it is preferable that the thickness of the first quantum well layer 54a is different from that of the second quantum well layer 54b. Thus, a wider luminescence wavelength band can be achieved.

Figure 11:
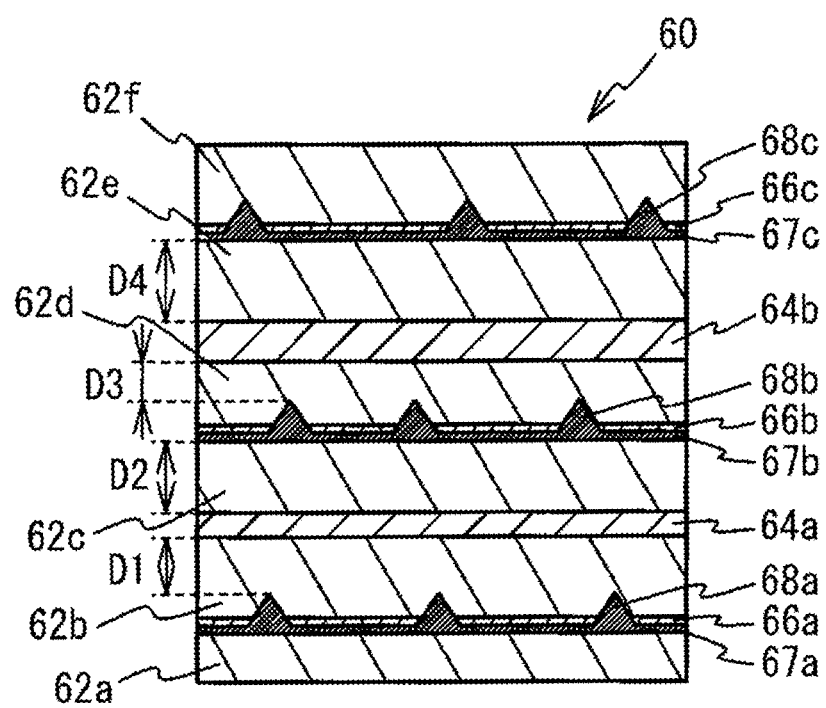
FIG. 11 illustrates a cross sectional view of an active layer of a photo diode in accordance with a third modified embodiment of a first embodiment.

FIG. 11 illustrates a cross sectional view of an active layer of a photo diode in accordance with a third modified embodiment of the first embodiment. As illustrated in FIG. 11, an active layer 60 of the photo diode of the third modified embodiment of the first embodiment has a structure in which a plurality of quantum dots are further provided on the upper side and the lower side of the active layer 50 of the photo diode of the second modified embodiment of the first embodiment. That is, a plurality of first quantum dots 68a are provided on a first barrier layer 62a, and a first InGaAs layer 66a is provided on a first wetting layer 67a having the same material as that of the plurality of first quantum dots 68a. A second barrier layer 62b is provided on the plurality of first quantum dots 68a and the first InGaAs layer 66a. A first quantum well layer 64a is provided on the second barrier layer 62b, and a third barrier layer 62c is provided on the first quantum well layer 64a. A plurality of second quantum dots 68b are provided on the third barrier layer 62c, and a second InGaAs layer 66b is provided on a second wetting layer 67b having the same material as that of the plurality of second quantum dots 68b. A fourth barrier layer 62d is provided on the plurality of second quantum dots 68b and the second InGaAs layer 66b. A second quantum well layer 64b is provided on the fourth barrier layer 62d, and a fifth barrier layer 62e is provided on the second quantum well layer 64b. A plurality of third quantum dots 68c are provided on the fifth barrier layer 62e, and a third InGaAs layer 66c is provided on a third wetting layer 67c having the same material as that of the plurality of third quantum dots 68c. A sixth barrier layer 62f is provided on the plurality of third quantum dots 68c and the third InGaAs layer 66c.

In the third modified embodiment of the first embodiment, the distance D1 between the first quantum well layer 64a and the plurality of first quantum dots 68a is smaller than an average of distances between centers of the plurality of first quantum dots 68a. The distance D2 between the first quantum well layer 64a and the plurality of second quantum dots 68b and the distance D3 between the second quantum well layer 64b and the plurality of second quantum dots 68b are smaller than an average of distances between centers of the plurality of second quantum dots 68b. The distance D4 between the second quantum well layer 64b and the plurality of third quantum dots 68c is smaller than an average of distances between centers of the plurality of third quantum dots 68c. Thus, the luminescence wavelength band from the quantum well can be widened. And the wide luminescence wavelength band can be achieved. When the thickness of the first quantum well layer 64a is different from that of the second quantum well layer 64b, the wider luminescence wavelength band can be achieved.

In the first embodiment, the lower clad layer is an n-type semiconductor, and the upper clad layer is a p-type semiconductor. However, the lower clad layer may be a p-type semiconductor, and the upper clad layer may be an n-type semiconductor.

Although the desirable embodiments of the present invention has been described in detail, the present invention is not limited to a certain embodiment, and it should be understood that the various change, substitutions, and alterations could be made hereto without departing from the spirit and scope of the invention.

The invention claimed is:

1. A semiconductor light-emitting element comprising:
   a lower clad layer that is provided on a substrate;
   an active layer that is provided on the lower clad layer and includes a quantum well layer, a plurality of quantum dots, and a first barrier layer, the first barrier layer being sandwiched between the quantum well layer and the plurality of quantum dots; and
   an upper clad layer that is provided on the active layer, wherein a distance between the quantum well layer and the plurality of quantum dots is smaller than an average of distances between centers of the plurality of quantum dots.

2. The semiconductor light-emitting element as claimed in claim 1, wherein the distance between the quantum well layer and the plurality of the quantum dots is 1/3 of an average of distances between centers of the plurality of quantum dots or more, and is 2/3 of the average or less.

3. The semiconductor light-emitting element as claimed in claim 1, wherein a thickness of the first barrier layer between the quantum well layer and the plurality of quantum dots is a thickness in which a tunnel current does not flow between the quantum well layer and the plurality of quantum dots.

4. The semiconductor light-emitting element as claimed in claim 1, wherein band gap energy of the quantum well layer is modulated by influence of a strain field caused by the plurality of quantum dots in a direction in parallel with an upper face of the substrate.

5. The semiconductor light-emitting element as claimed in claim 1, wherein:
   the quantum well layer and the quantum dot is a III-V group compound semiconductor layer; and
   at least one of the quantum well layer and the quantum dot includes In as a III group element.

6. The semiconductor light-emitting element as claimed in claim 1, wherein:
   the active layer includes a plurality of the quantum well layers; and
   thicknesses of the plurality of quantum well layers are different from each other.

7. The semiconductor light-emitting element as claimed in claim 1, wherein:
   the active layer further includes a second barrier layer;
   the quantum well layer is sandwiched between the first barrier layer and the second barrier layer; and
   band gap energy of the quantum well layer is smaller than that of the first barrier layer and the second barrier layer.

8. The semiconductor light-emitting element as claimed in claim 1, wherein:
   the active layer further includes a third barrier layer,
   the plurality of quantum dots is sandwiched between the first barrier layer and the third barrier layer, and
   band gap energy of the plurality of quantum dots is smaller than that of the first barrier layer and the third barrier layer.

9. The semiconductor light-emitting element as claimed in claim 1, wherein the first barrier layer is sandwiched between the quantum well layer and the plurality of quantum dots in a thickness direction from the lower clad layer to the upper clad layer.

10. The semiconductor light-emitting element as claimed in claim 1, wherein the distance between the quantum well layer and the plurality of quantum dots is in a thickness direction from the lower clad layer to the upper clad layer.

11. The semiconductor light-emitting element as claimed in claim 1, wherein band gap energy of the quantum well layer is smaller than that of the first barrier layer.

12. The semiconductor light-emitting element as claimed in claim 1, wherein the quantum well layer does not have a quantum dot therein.

13. The semiconductor light-emitting element as claimed in claim 1, wherein the quantum well layer is made of a material different from that of the first barrier layer.

14. The semiconductor light-emitting element as claimed in claim 1, wherein the quantum well layer has a thickness smaller than that of the first barrier layer.

15. The semiconductor light-emitting element as claimed in claim 5, wherein:
the quantum well layer is an InGaAs layer; and
the quantum dot is InAs.

16. The semiconductor light-emitting element as claimed in claim 5, wherein:
the quantum well layer is a GaAs layer; and
the quantum dot is AlInAs.

17. The semiconductor light-emitting element as claimed in claim 5, wherein at least one of the quantum well layer and the quantum dot includes nitrogen as a V group element.

18. The semiconductor light-emitting element as claimed in claim 15, wherein the first barrier layer is GaAs layers.

* * * * *